(12) United States Patent
Victoria (10) Patent No.: US 12,422,455 B2
(45) Date of Patent: Sep. 23, 2025

(54) TEMPERATURE RESISTANT CONTACT UNIT HOLDER RECEPTACLE ASSEMBLY AND RELATED METHODS

(71) Applicant: SEMICONDUCTOR COMPONENTS INDUSTRIES, LLC, Phoenix, AZ (US)

(72) Inventor: Novellie Pangilinan Victoria, Cabuyao (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 205 days.

(21) Appl. No.: 18/068,581

(22) Filed: Dec. 20, 2022

(65) Prior Publication Data
US 2024/0201224 A1    Jun. 20, 2024

(51) Int. Cl.
*G01R 1/04* (2006.01)
*G01R 31/28* (2006.01)
*H01L 21/66* (2006.01)

(52) U.S. Cl.
CPC ....... *G01R 1/0466* (2013.01); *G01R 31/2889* (2013.01); *H01L 22/30* (2013.01)

(58) Field of Classification Search
CPC .... G01R 31/2889; G01R 1/0466; H01L 22/30
See application file for complete search history.

(56) References Cited

U.S. PATENT DOCUMENTS

| 5,154,630 | A | 10/1992 | Kamono et al. |
| 6,386,913 | B1* | 5/2002 | Mohammad ........... H01R 24/50 439/579 |
| 6,642,728 | B1* | 11/2003 | Kudo ................ H01L 21/67242 324/755.05 |
| 8,547,128 | B1* | 10/2013 | Sochor ............... H01R 13/2421 324/755.05 |
| 2003/0137316 | A1* | 7/2003 | Kazama ............. G01R 1/06772 324/755.05 |
| 2011/0021049 | A1* | 1/2011 | Ramasubramanian ...................... H01R 13/521 439/271 |
| 2018/0088150 | A1* | 3/2018 | Kuga ................. G01R 1/07314 |

FOREIGN PATENT DOCUMENTS

CN        212230649 U    12/2020

* cited by examiner

*Primary Examiner* — Eman A Alkafawi
*Assistant Examiner* — Suresh K Rajaputra
(74) *Attorney, Agent, or Firm* — Brake Hughes Bellermann LLP (57) ABSTRACT

A contact unit holder (CUH) receptacle assembly and a method of manufacturing the CUH receptacle assembly are disclosed, where the receptacle assembly includes a receptacle cover removably attached to a receptacle base. The device may include a receptacle housing extending from an inner surface of the receptacle base to an inner surface of the receptacle cover, a through-hole defined by the receptacle housing, the through-hole extending from an outer surface of the receptacle base to the inner surface of the receptacle cover, and a receptacle pin disposed in the through-hole and protruding from the outer surface of the receptacle base, the receptacle pin being configured to contact a semiconductor device under test (DUT).

17 Claims, 9 Drawing Sheets

TEMPERATURE RESISTANT CONTACT UNIT HOLDER RECEPTACLE ASSEMBLY AND RELATED METHODS

FIELD

Aspects of this document relate generally to apparatus and methods for semiconductor testing.

BACKGROUND

Semiconductor fabrication processes involve many steps. One of the steps is testing, which is conducted at two levels—the wafer test (also called die sort or probe test) that tests wafers, and the package test (also called final test) that is conducted after packaging and prior to the packaged integrated circuits (IC) being incorporation into electronic apparatus. Semiconductor test equipment, or automated test equipment (ATE), is a device used for final testing and provides electrical signals to a semiconductor device or packaged IC to compare output signals against expected values to test if the semiconductor device works as specified in the design specifications. Contact pins associated with the ATE may be placed in physical and electrical contact with metallized contact surfaces of a packaged IC or a device under test (DUT). These contacts may include test pads, bond pads, solder balls, and/or other conductive media. The functioning of DUTs may be tested by invoking stimuli on various inputs and measuring responses on outputs at the metallized contact surfaces.

SUMMARY

Disclosed are novel devices and methods to individually separate the receptacle pins between a contact unit holder (CUH) receptacle base and a receptacle cover to prevent contact between receptacle pins and to prevent shorted connections. The novel receptacle cover also houses the receptacle pins such that any twisting or bending of the receptacle pins is prevented. The receptacle pins are provided in bores or through-hole in a receptacle housing extending from the receptacle base to the receptacle cover. In an example, the through-holes are precision cut. In some examples, the through-holes for the receptacle pins may be sealed with individual sealing member (such as Silicon rubber) to provide separation between the cold air of a handler chamber and the ambient air. Thus, the novel devices and methods also provides an electrical path/connection that can handle and run under extreme temperature condition in which issues related to contact resistance (CRES) and leakage failure are mitigated.

In one general aspect, there is provided a contact unit holder (CUH) receptacle assembly including: a receptacle cover removably attached to a receptacle base, a receptacle housing extending from an inner surface of the receptacle base to an inner surface of the receptacle cover, a through-hole defined by the receptacle housing, the through-hole extending from an outer surface of the receptacle base to the inner surface of the receptacle cover, and a receptacle pin disposed in the through-hole and protruding from the outer surface of the receptacle base, the receptacle pin being configured to contact a semiconductor device under test (DUT).

In another general aspect, a contact unit holder (CUH) receptacle assembly can include: a receptacle cover removably attached to a receptacle base, a receptacle housing extending from an inner surface of the receptacle base to an inner surface of the receptacle cover, a through-hole defined by the receptacle housing, the through-hole extending from an outer surface of the receptacle base to the inner surface of the receptacle cover, a receptacle pin disposed in the through-hole and protruding from the outer surface of the receptacle base, the receptacle pin being configured to contact a semiconductor device under test (DUT), and a seal disposed on the outer surface of the receptacle base and being configured to seal an opening of the through-hole around the receptacle pins.

In another general aspect, a method of manufacturing a contact unit holder (CUH) receptacle assembly can include: removably attaching a receptacle cover to a receptacle base, forming a receptacle housing extending from an inner surface of the receptacle base to an inner surface of the receptacle cover, forming a through-hole in the receptacle housing, the through-hole extending from an outer surface of the receptacle base to the inner surface of the receptacle cover, disposing a receptacle pin in the through-hole, the receptacle pin protruding from the outer surface of the receptacle base, the receptacle pin being configured to contact a semiconductor device under test (DUT), and disposing a seal on the outer surface of the receptacle base, the seal being configured to seal an opening of the through-hole around the receptacle pin.

The details of one or more implementations are set forth in the accompanying drawings and the description below. Other features will be apparent from the description and drawings, and from the claims.

DETAILED DESCRIPTION

During final test, low temperature tests may be conducted on the DUT under temperatures of about −45° C. At these low temperatures, the setup and yield performance of the CUH receptacle assembly 40 may be degraded through leakage and use over time. For example, the low temperature air at about −45° C. may bleed from the handler chamber (including the contact chuck 10, the DUT 20, and the semiconductor test socket contractor 30) to the tester side and the loadboard 50 causing frosting at the loadboard 50 and affecting the performance of the electrical components at the back of the loadboard 50. In some examples, the CUH receptacle assembly 40 may degrade in yield performance due to receptacle pins 410 being bent through use over time.

The bent pins also may cause shorted connections and it may be difficult to replace the bent and twisted receptacle pins 410.

Disclosed are novel devices and methods to individually separate the receptacle pins 410 within a CUH receptacle housing 415 (also can be referred to as a receptable housing) disposed between the CUH receptacle base 404 (also can be referred to as a receptable base) and the CUH receptacle cover 402 (also can be referred to as a receptable cover). Receptacle pins 410 are individually provided in through-holes of the CUH receptacle housing 415. The CUH receptacle housing 415 prevents contact between the receptacle pins 410 and guides the movement of the receptacle pins 410. Disclosed are novel devices and methods where seal(s) may separate each of the receptacle pins 410 to ensure that a temperature of the handler chamber (about −45° C.) is properly segregated from the ambient/hot temperature (+25° C./+75° C.) to prevent condensation and moisture in the handler chamber and the loadboard 50 that may lead to low yield performance of the device testing and lead to jamming issues.

Figure 1:
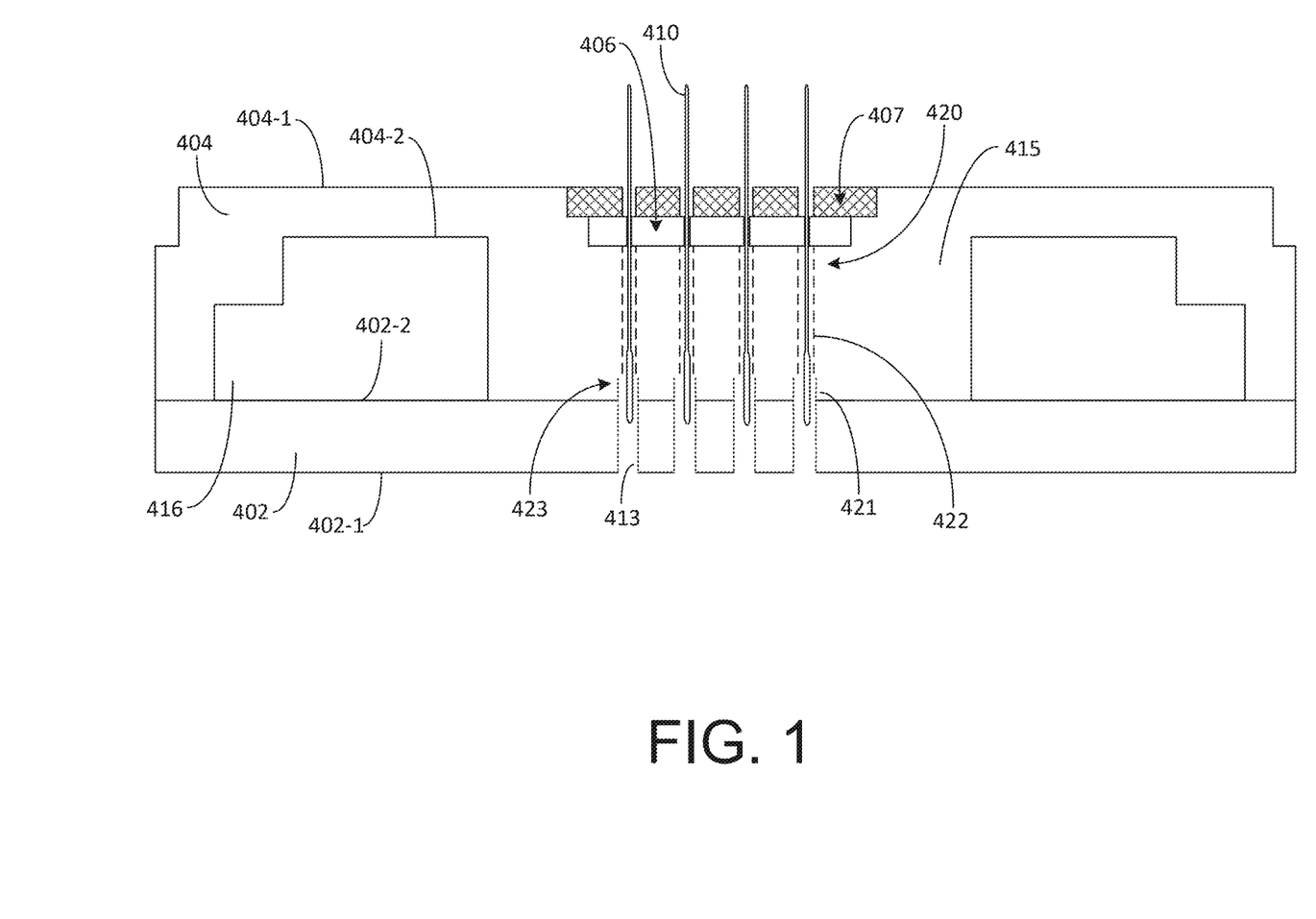
FIG. 1 is a diagram illustrating an example of a cross-sectional view of a contact unit holder (CUH) receptacle assembly.

FIG. 1 is a diagram illustrating an example of a cross-sectional view of a contact unit holder (CUH) receptacle assembly 45. As shown in FIG. 1, the CUH receptacle assembly includes a CUH receptacle cover 402 that is removably attached to a CUH receptacle base 404. The CUH receptacle base 404 has an inner surface 404-2 and an outer surface 404-1. Likewise, the CUH receptacle cover 402 has an inner surface 402-2 and an outer surface 402-1. A CUH receptacle housing 415 extends from an inner surface 404-2 of the CUH receptacle base 404 to an inner surface 402-2 of the CUH receptacle cover 402.

Through-holes 420 are formed in the CUH receptacle housing 415, and the through-holes 420 extend from an outer surface 404-1 of the CUH receptacle base 404 to the inner surface 402-2 of the CUH receptacle cover 402. Thus, the through-hole 420 may be defined by the CUH receptacle housing 415. In some examples, the through-holes 420 may include bores having two different diameters—a first bore 421 having a first diameter and a second bore 422 having a second diameter. A diameter of the first bore 421 may be greater than a diameter of the second bore 422. In some examples, the second bore 422 extends from the outer surface 404-1 of the CUH receptacle base 404 towards the inner surface 402-2 of the CUH receptacle cover 402. In some examples, the first bore 421 extends from the inner surface 402-2 of the CUH receptacle cover 402 towards the outer surface 404-1 of the CUH receptacle base 404. Thus, the first bore 421 and the second bore 422 may form a stepped structure at the junction 423 of the first bore 421 and the second bore 422.

Orifices or openings 413 are formed in the CUH receptacle cover 402 to correspond with each of the through-holes 420.

Receptacle pins 410 are disposed in respective through-hole of the through-holes 420 and protrude from the outer surface 404-1 of the CUH receptacle base 404. In some examples, the receptacle pins 410 may be configured to contact the contact pads of the DUT 20 disposed in the semiconductor test socket contractor 30. In some examples, a seal 406 may be applied to an outer surface of the CUH receptacle base 404 to seal the opening of the through-holes 420 around the receptacle pins 410. In some examples, the seal 406 may be Silicone rubber seal. A CUH receptacle base cover 407 (also can be referred to as a CUH receptacle base cover) may be removably attached to the CUH receptacle base to affix the seal 406 to the outer surface of the CUH receptacle base 404. As described in further details below, a cut-out region or a recessed channel 416 may be formed along an outer perimeter of the of the CUH receptacle housing 415. The recessed channel 416 may separate the CUH receptacle housing 415 from a side wall of the CUH receptacle base 404. Further details regarding the elements illustrated in FIG. 1 and other features are described below with reference to FIGS. 2-12.

Figure 2:
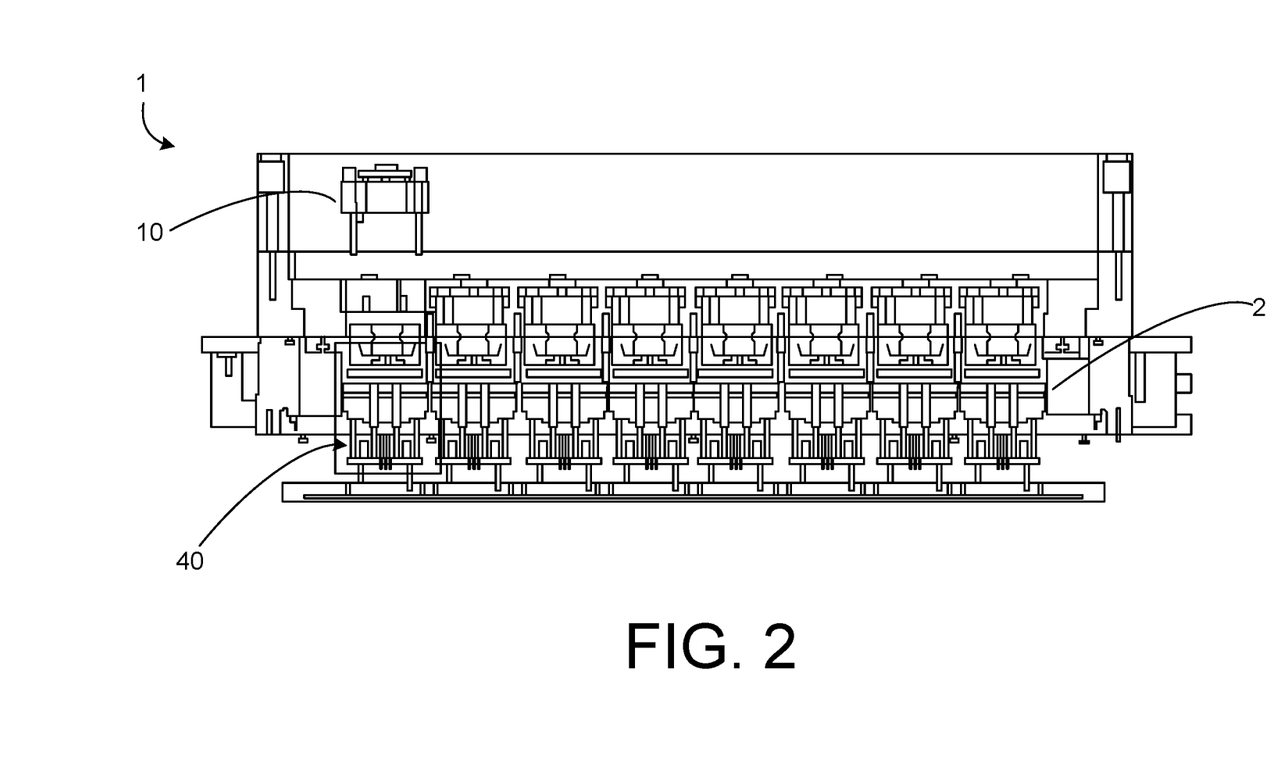
FIG. 2 is a diagram illustrating an example of a CUH housing assembly disposed in an automated test equipment (ATE).
Figure 3:
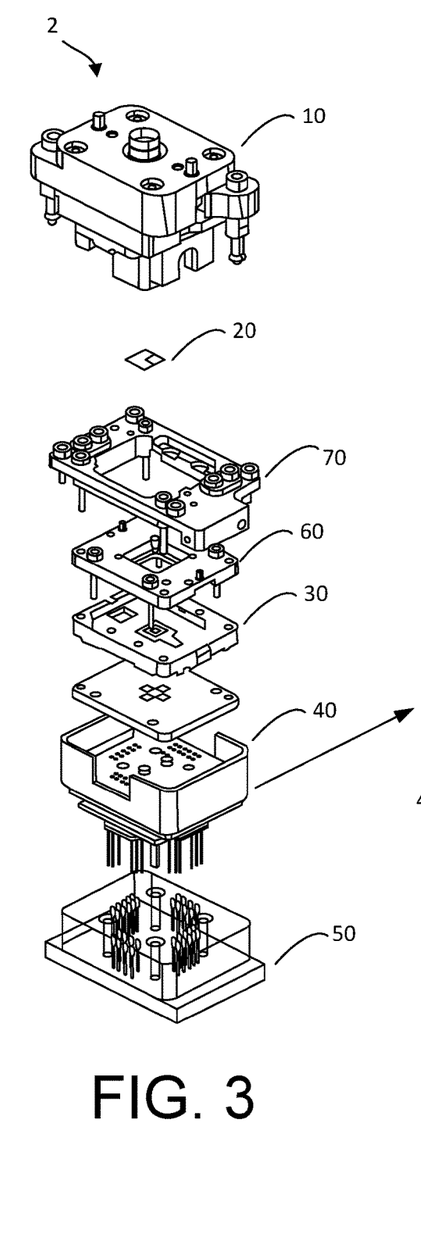
FIG. 3 is a diagram illustrating an example of an exploded perspective view of a CUH assembly.

As shown in FIG. 2, a CUH housing assembly 1 or other media provides an interface between an ATE and DUTs 20. In some examples, the CUH housing assembly 1 may include one or more CUH assembly 2, as illustrated in FIG. 3. As shown in FIG. 3, the CUH housing assembly 1 may include one or more contact chuck(s) 10 into which DUT(s) 20 is (are) inserted. During automated testing, a DUT 20 may be inserted into the contact chuck(s) 10 by a handler and held into position for the duration of the testing. While in the contact chuck(s) 10, contact surfaces on the DUT, such as, for example solder balls in the case of a ball grid array (BGA), contact the contactor pins in the CUH housing assembly 1. After insertion into the socket, the DUT may be electrically connected to the ATE through the CHU housing assembly 1, its sub-assemblies, and other interfacing apparatus.

As shown in FIG. 3, the CUH assembly 2 includes a contact chuck 10 that is configured to receive a DUT 20 for testing. The contact chuck 10 together with the DUT 20 may be inserted into the semiconductor test socket contractor 30 for the duration of the final test. CUH top plate 70 (also can be referred to as a top plate) and CUH centering plate 60 (also can be referred to as a centering plate) may be disposed between the contact chuck 10 and the test socket contractor 30 and assist in electrically connecting the DUT 20 to the ATE for the duration of the final test. In some examples, the contact chuck 10 that handles the DUT 20 may be pre-aligned at the CUH top plate 70 to be centered before the testing is commenced. The CUH receptacle assembly 40 may connect the semiconductor test socket contractor 30 to the loadboard 50.

During final test, low temperature tests may be conducted that include testing the DUT under temperatures of about −45° C. At these low temperatures, the setup and yield performance of the CUH receptacle assembly 40 may be degraded through leakage and use over time. For example, the low temperature air at about −45° C. may bleed from the handler chamber (including the contact chuck 10, the DUT 20, and the semiconductor test socket contractor 30) to the tester side and the loadboard 50 causing frosting at the loadboard 50 and affecting the performance of the electrical components at the back of the loadboard 50. In addition, the ambient air (at temperatures of about +25° C. to +45° C.) may creeps through the openings for the receptacle pins 410 in the CUH receptacle cover 402 and the CUH receptacle base 404 into the handler chamber, which may cause moisture buildup, leading to leakage and frosting. Disclosed are novel devices and methods where one or more seal(s) individually separates each of the receptacle pins 410 to ensure that a temperature of the handler chamber (about −45° C.) is properly separated from the ambient/hot temperature (+25° C./+75° C.) to prevent condensation that will result in moisture buildup and frosting inside the handler chamber. The condensation and moisture in the handler chamber may lead to low yield performance of the device testing and lead to jamming issues.

In some examples, the CUH receptacle assembly 40 may degrade in yield performance due to the receptacle pins 410 being bent and twisted due to the cold air bleeding through receptacle pins 410 and through use over time. It may be difficult to replace the bent and twisted receptacle pins 410. The bent pins also may cause shorted connections, which may mislead the technician during isolation and repair on the cause of the problem caused due to the bent pins. In addition, it may be difficult to replace the bent/broken receptacle pins 410 due to docking arrangement of the receptacle pins 410.

Disclosed are novel devices and methods to individually separate the receptacle pins 410 within the CUH receptacle base 404 and the CUH receptacle cover 402 to prevent contact between the receptacle pins 410, to prevent shorted connections, and to guide the movement of the receptacle pins 410. The CUH receptacle cover 402 houses the receptacle pins 410 in a novel manner such that any twisting or bending of the receptacle pins 410 is prevented. The receptacle pins 410 are provided in through-holes 420 in a CUH receptacle housing 415 extending from the CUH receptacle cover 402 to the CUH receptacle base 404. In some examples, the through-holes 420 are precision cut. In some examples, the through-holes 420 for the receptacle pins 410 may be sealed with individual sealing member (for example, using Silicon rubber seals) to provide adequate separation between the cold air of the handler chamber and the ambient air. Thus, the novel devices and methods provides an electrical path/connection that can be run under extreme temperature condition in which issues related to contact resistance (CRES) and leakage failure are mitigated.

Figure 4:
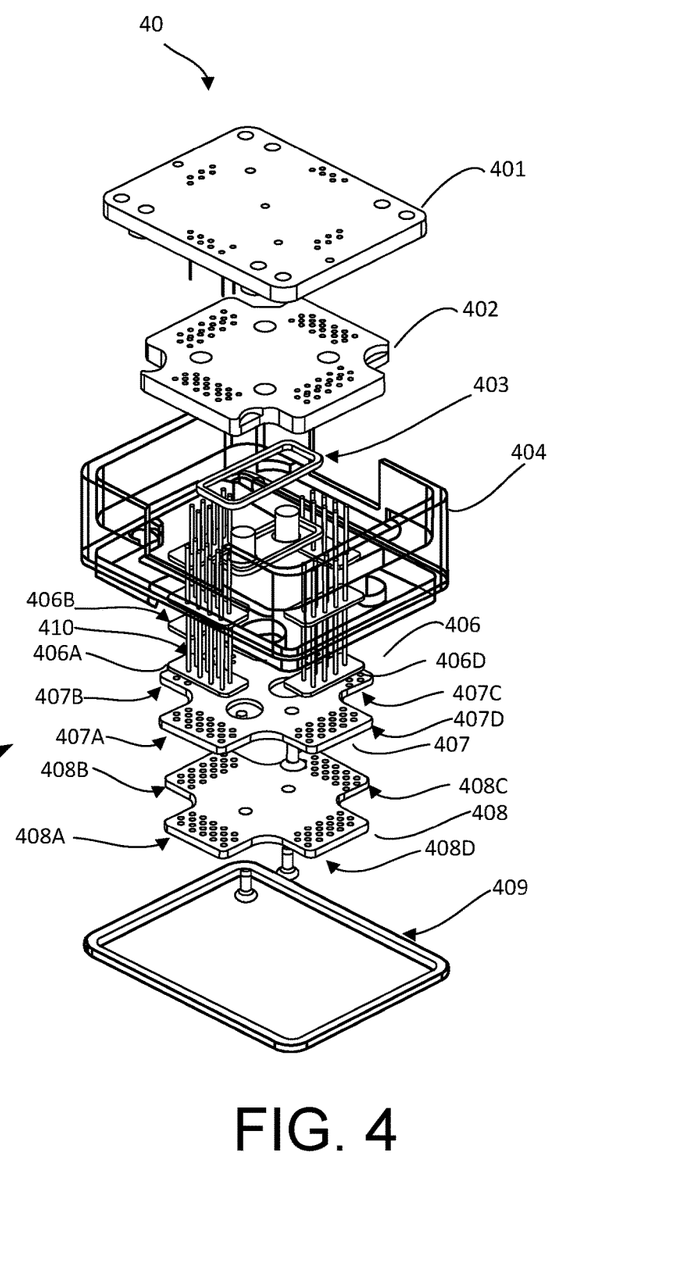
FIG. 4 is a diagram illustrating an example of an exploded perspective view of a CUH receptacle assembly.

As shown in FIG. 4, the CUH receptacle assembly 40 includes an interposer PCB board or socket 401, and a CUH receptacle cover 402 that is disposed below the interposer PCB board or socket 401. In some examples, the interposer PCB board or socket 401 may electrically connect a footprint of the socket 401 to a footprint of the loadboard 50.

Figure 5:
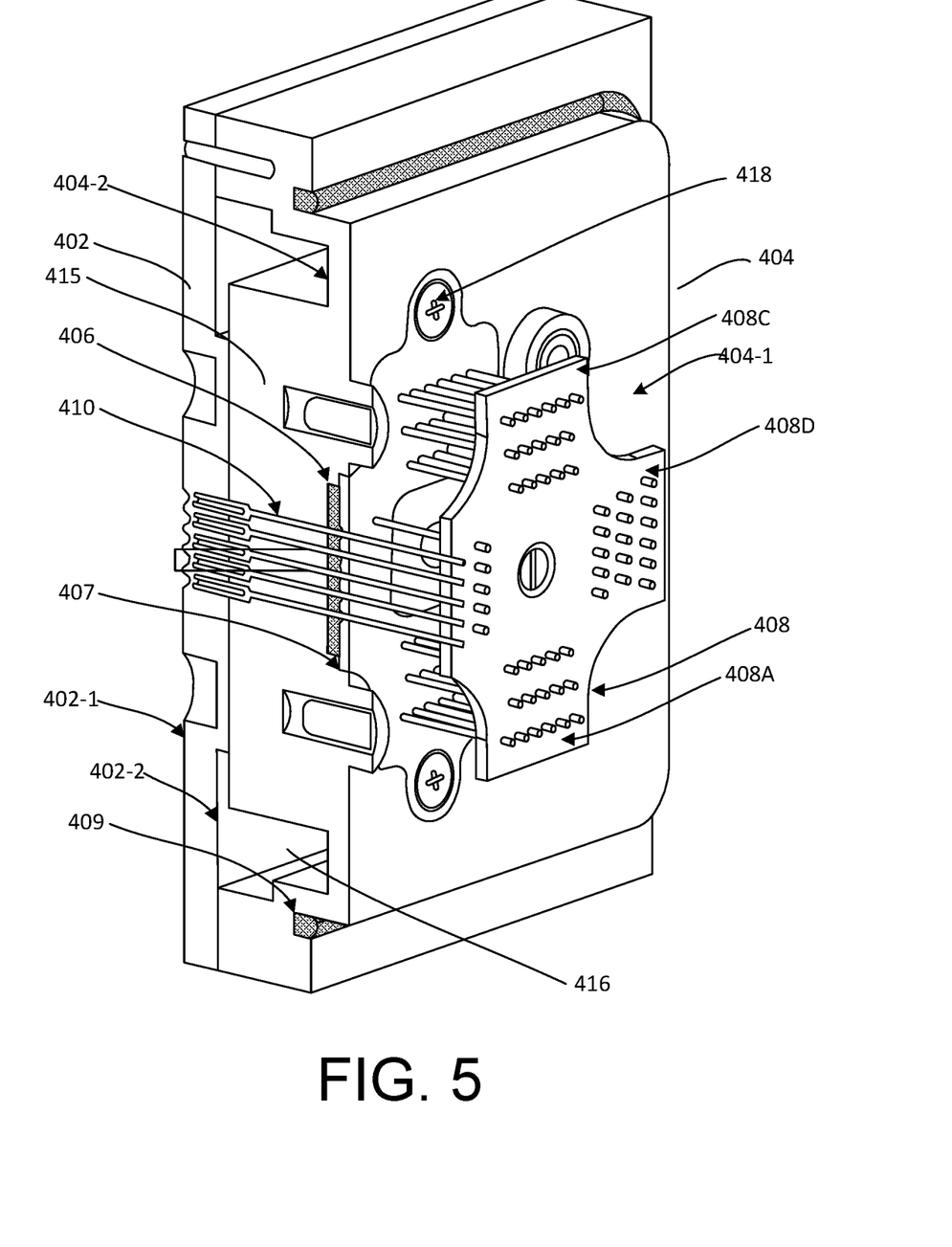
FIGS. 5 through 7 are diagrams illustrating an example of a CUH receptacle assembly.
Figure 6:
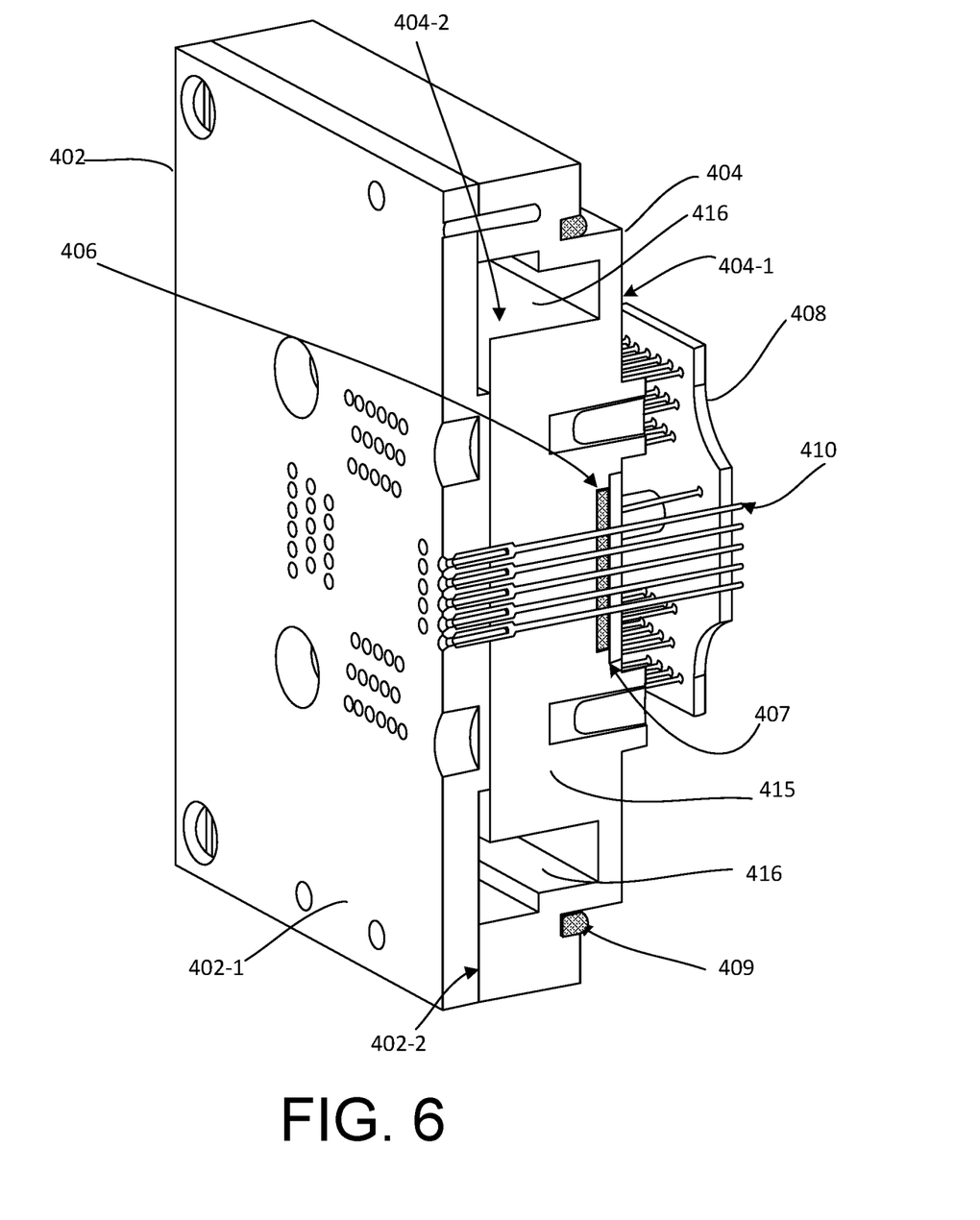

As shown in FIGS. 4-6, a CUH receptacle base 404 may be removably attached to the CUH receptacle cover 402 to form an enclosed space. A first silicon rubber seal 403 may be disposed between the CUH receptacle base 404 and the CUH receptacle cover 402. In some examples, the CUH receptacle cover 402 is removably attached to the CUH receptacle base 404 using one or more screws passing through a plane of the CUH receptacle cover 402 and a plane of the CUH receptacle base 404. In some examples, the interposer PCB board or socket 401 may be disposed closer to the DUT 20 than the CUH receptacle cover 402. In some examples, the CUH receptacle cover 402 may be disposed closer to the DUT 20 than the CUH receptacle base 404.

Figure 7:
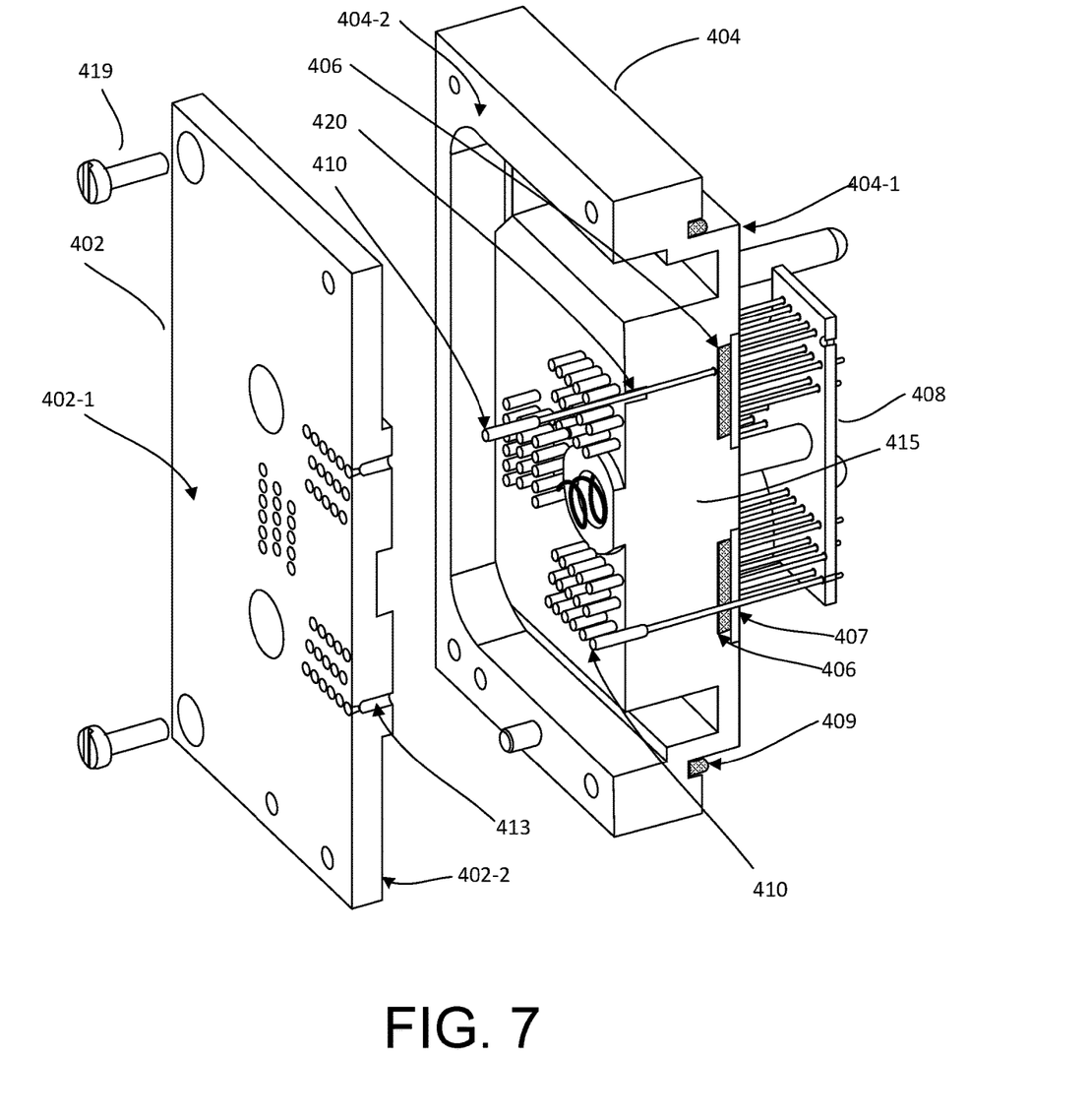

In some examples, the CUH receptacle base 404 and the CUH receptacle cover 402 may have a quadrilateral cross-section. In some examples, the CUH receptacle base 404 may be attached to the CUH receptacle cover 402 using at least one screw 419. In some examples, as illustrated in FIG. 7, the CUH receptacle base 404 may be attached to the CUH receptacle cover 402 by four screws 419, each screwed into a corner of the quadrilateral CUH receptacle base 404 to hold the CUH receptacle base 404 and the CUH receptacle cover 402 together. The screws 419 illustrated in FIG. 7 is just an example of an attaching mechanism, and various other attaching mechanism such as, for example, rivets, bolts, clips, clamp, etc. may be used, without deviating from the spirit or scope of the illustrated examples.

In some examples, four sets of receptacle pins 410 are disposed to pass through the CUH receptacle base 404 and to sit in the CUH receptacle cover 402. In some examples, each of the receptacle pins 410 may be configured to contact the contact pads of the DUT 20 disposed in the semiconductor test socket contractor 30. In some examples, each of the four sets of receptacle pins 410 are disposed at a distance from the center of the CUH receptacle base 404 and arranged in respective groups that are each parallel to one side of the quadrilateral CUH receptacle base 404. The arrangement of the receptacle pins 410 is just an example arrangement, and various other arrangement of the receptacle pins 410 such as, for example, the receptacle pins 410 being disposed in a circular pattern around the center of the CUH receptacle base 404 or the receptacle pins 410 being disposed further away from the center of the quadrilateral CUH receptacle base 404 and closer to the periphery, etc. may be used, without deviating from the spirit or scope of the illustrated examples. In some examples, each set of the four sets of receptacle pins 410 may have the same number of pins. In some examples, one or more set of the four sets of receptacle pins 410 may have a different number of pins than the other set(s). Further details regarding the arrangement and configuration of the receptacle pins 410 is provided below.

One or more of the receptacle pins 410 can be easily replaced in the examples disclosed above. First, the four screws on the CUH receptacle cover 402 may be unscrewed and the CUH receptacle cover 402 may be separated from the CUH receptacle base 404. The receptacle pins 410 that are to be changed may be swapped out and replaced with new receptacle pins 410. Then, the CUH receptacle cover 402 may be attached to the CUH receptacle base 404 by the four screws 419.

As illustrated in FIG. 4, in an example, four seals 406, such as for example, 406A, 406B, 406C, and 406D (fourth seal 406D is not shown in the view depicted in FIG. 4) are disposed on the CUH receptacle base 404 to ensure sealing of the through-holes 420 in the CUH receptacle housing 415 during and after replacement of the receptacle pins 410. In some examples, the seals may be Silicone rubber seals. The Silicone rubber seals are just an example of the seals 406, and various other seals such as, for example, rubber seals, Silicone seals, Thermoplastic (TPE) seals, and other polymer seals, may be used to ensure sealing and to prevent leaks without deviating from the spirit or scope of the illustrated examples.

The seals 406 also ensures proper separation of the chamber air from the handler chamber, which may be circulating at temperatures of about −45° C. from the ambient air. In addition, the seals 406 may safeguard against the ambient air (at temperatures of about +25° C. to +45° C.) flowing through the openings for the receptacle pins 410 in the CUH receptacle cover 402 and the CUH receptacle base 404 into the handler chamber, which may cause moisture buildup, leading to leakage and frosting.

Figure 8:
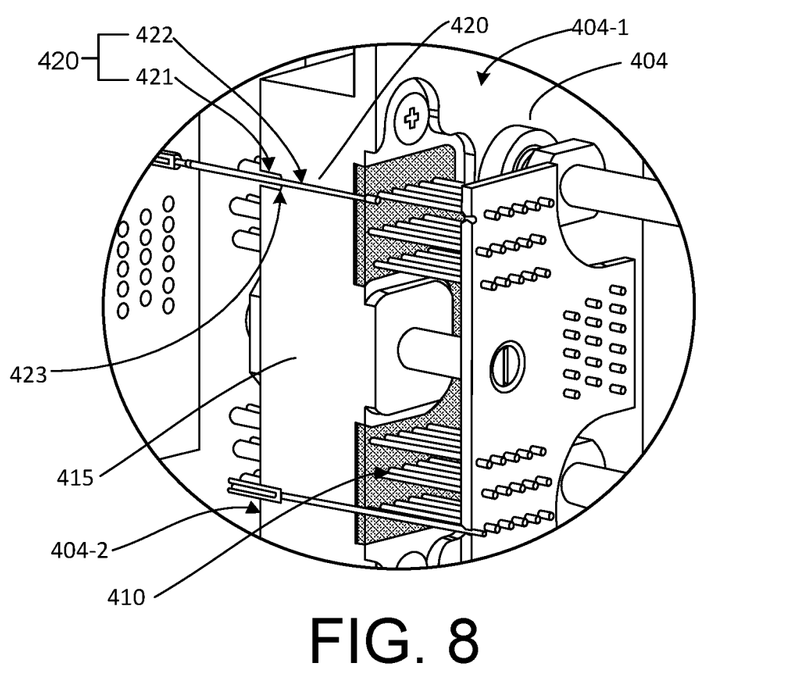
FIGS. 8 through 11 are diagrams illustrating examples of simplified perspective cross-sectional views of portions of a CUH receptacle assemblies of FIGS. 5 through 7.

The number of the seals 406 may be varied without deviating from the spirit or scope of the illustrated examples. For example, as shown in FIG. 8, one seal 406 may be disposed on the CUH receptacle base 404 to ensure sealing of the through-holes 420 during and after replacement of the receptacle pins 410. In other examples, two seals 406 may be disposed side-by side on the CUH receptacle base 404 to ensure sealing of the through-holes 420 during and after replacement of the receptacle pins 410.

As shown in FIGS. 4-5, CUH receptacle base cover 407 may be disposed on the CUH receptacle base 404. In some examples, as shown in FIGS. 4-5, the CUH receptacle base cover 407 may have a quadrilateral center with four pads 407A, 407B, 407C, and 407D extending from each side of the quadrilateral center. In some examples, the CUH receptacle base cover 407 may keep the seals 406 in place. In some examples, the CUH receptacle base cover 407 may be configured to affix the seal 406 to the outer surface of the CUH receptacle base 404.

In some examples, as illustrated in FIG. 5, the CUH receptacle base cover 407 may be removably attached to the CUH receptacle base 404 by screws 418. In some examples, each of the pads of the CUH receptacle base cover 407 may be screwed to the CUH receptacle base 404 with the seals 406 disposed between the CUH receptacle base cover 407 and the CUH receptacle base 404. The screws 418 illustrated in FIG. 5 are just an example of an attaching mechanism, and various other attaching mechanism such as, for example, rivets, bolts, clips, clamps, etc. may be used to dispose the CUH receptacle base cover 407 on the CUH receptacle base 404, without deviating from the spirit or scope of the illustrated examples.

As shown in FIGS. 4-5, a floater pin aligner plate 408 may be disposed over the CUH receptacle base cover 407. In some examples, the floater pin aligner plate 408 may protect the receptacle pins 410 during docking to the loadboard 50 to ensure alignment of the receptacle pins 410 and to prevent bent and broken receptacle pins 410. In some examples, the floater pin aligner plate 408 may be disposed at a distance from the CUH receptacle base cover 407. In some examples, a post that is positioned in approximately a center of the CUH receptacle base 404 may support the floater pin aligner plate 408. In some examples, as shown in FIGS. 4-5, the floater pin aligner plate 408 may have a quadrilateral center with four pads 408A, 408B, 408C, and 408D extending from each side of the quadrilateral center. As shown in FIG. 5, one set of receptacle pins 410 are disposed to pass through each of the four pads 408A, 408B, 408C, and 408D.

As shown in FIGS. 4-5, a third seal 409 may be disposed around an outer side of the CUH receptacle base 404. In some examples, the third seal 409 may ensure that leaks are prevented from around the CUH receptacle assembly 40 during removal and installation on the CUH receptacle assembly 40 or the CUH assembly 2. In some examples, the third seal 409 may be a Silicone rubber seal.

Throughout this disclosure the term over is used with respect to various components and elements. These terms are not meant to convey position, up or down, in the drawings, but is meant to convey a relative outer or inner position. For example, using the up (above) and down (below) directions of FIG. 5, a component placed above the CUH receptacle base 404 would be over the CUH receptacle base 404, and a component placed below the CUH receptacle base 404 would similarly be over the CUH receptacle base 404. The term over is not meant to convey that an element is directly in contact with the element which it is over. For example, an intermediary element may be coupled directly with the CUH receptacle base 404 and a secondary component may be coupled directly with the intermediary element and, although the secondary element may not directly contact the CUH receptacle base 404, the secondary element will nevertheless be coupled over the CUH receptacle base 404 as it will be a more outer layer relative to the CUH receptacle base 404. When the CUH receptacle assembly 40 is in use the CUH receptacle cover 402 may be closer to the DUT 20 than the CUH receptacle base 404, i.e., the CUH receptacle cover 402 may face the DUT 20.

As shown in FIGS. 5-6, a CUH receptacle housing 415 may be formed in the enclosed chamber between the CUH receptacle base 404 and the CUH receptacle cover 402. The CUH receptacle housing 415 may extend from an inner surface 404-2 of the CUH receptacle base 404 to an inner surface 402-2 of the CUH receptacle cover 402. In some examples, the CUH receptacle housing 415 may contact an inner side of the CUH receptacle cover 402. In some examples, the CUH receptacle housing 415 may abut upon the CUH receptacle cover 402. As shown in FIGS. 5-6, a cut-out region or a recessed channel 416 may be formed along an outer perimeter of the of the CUH receptacle housing 415. The recessed channel 416 may separate the CUH receptacle housing 415 from a side wall of the CUH receptacle base 404. The side wall of the CUH receptacle base 404 may form a ring around the CUH receptacle housing 415.

As shown in FIG. 6, through-holes 420 may be formed in the CUH receptacle housing 415. In some examples, the through-holes 420 may be uniformly disposed along a perimeter of the CUH receptacle housing 415 and at a distance from a center of the CUH receptacle housing 415. Each of the through-holes 420 may be configured to accommodate a receptacle pin 410. The receptacle pins 410 may protrude out of the through-holes 420 beyond the outer surface 404-1 of the CUH receptacle base 404. Each of the through-holes 420 may guide the movement of each receptacle pin 410 disposed in the through-holes 420 so that the receptacle pin 410 moves freely in the channel formed within the through-holes 420 and short connection is prevented between the receptacle pins 410.

Figure 9:
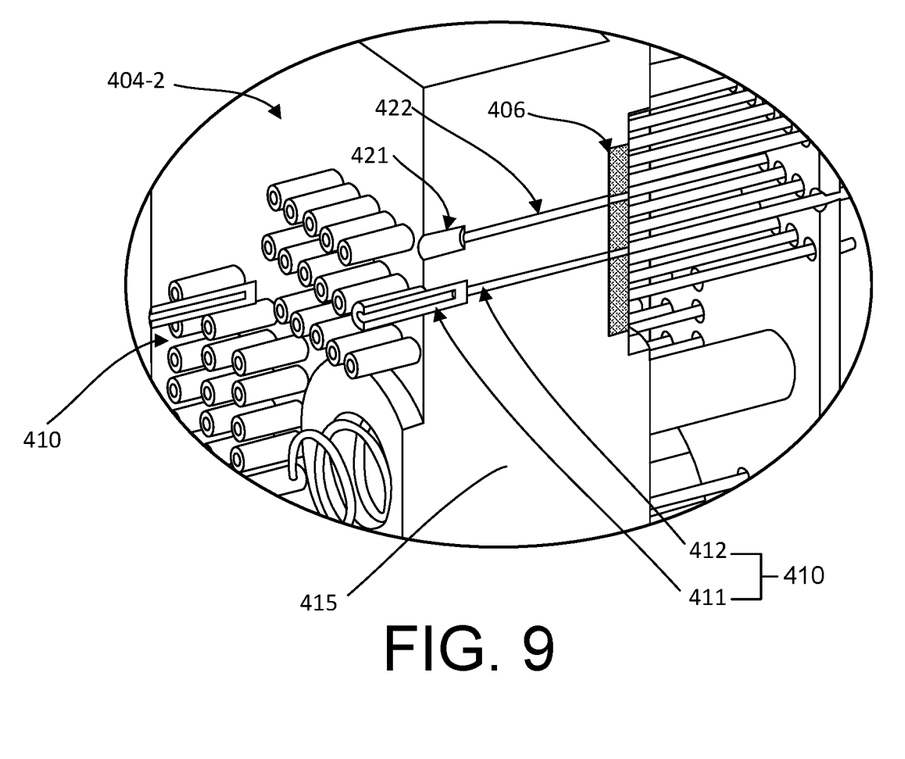

As shown in FIGS. 7-9, seal 406 may be disposed at an outer surface 404-1 of the CUH receptacle base 404 to ensure sealing of the through-holes 420 in the CUH receptacle housing 415. The seal 406 is configured to individually seal the through-holes 420 around each of the receptacle pins 410.

As shown in FIG. 8, in some examples, each of the through-holes 420 may include bores having two different diameters—a first bore 421 having a first diameter and a second bore 422 having a second diameter. A diameter of the first bore 421 may be greater than a diameter of the second bore 422.

In some examples, the second bore 422 extends from the outer surface 404-1 of the CUH receptacle base 404 towards the inner surface 402-2 of the CUH receptacle cover 402. In some examples, the second bore 422 may terminate before reaching the inner surface 402-2 of the CUH receptacle cover 402. In some examples, the first bore 421 extends from the inner surface 402-2 of the CUH receptacle cover 402 towards the outer surface 404-1 of the CUH receptacle base 404. In some examples, the first bore 421 may terminate before reaching the inner surface 404-2 of the CUH receptacle base 404. In some examples, the first bore 421 may terminate at an end of the second bore 422 distal from the outer surface 404-1 of the CUH receptacle base 404. Thus, the first bore 421 and the second bore 422 may form a stepped structure at the junction 423 of the first bore 421 and the second bore 422. In other words, the first bore 421 and the second bore 422 may form a tapered opening in the CUH receptacle housing 415 and the CUH receptacle base 404.

In some examples, as shown in FIG. 9, each of the receptacle pins 410 may include two cylindrical portions, a first cylindrical portion 411 and a second cylindrical portion 412. A diameter of the first cylindrical portion 411 may be greater than a diameter of the second cylindrical portion 412. In some examples, the diameter of the first cylindrical portion 411 may correspond to and be slightly less than the diameter of the first bore 421. In some examples, the diameter of the second cylindrical portion 412 may correspond to and be slightly less than the diameter of the second bore 422. Thus, the through-holes 420 may guide the movement of the receptacle pins 410, which may be retractable within the through-holes 420. In some examples, the first cylindrical portion 411 may be slidable in the first bore 421 and the second cylindrical portion 412 may be slidable in the second bore 422.

In some examples, the stepped portion of the through-holes 420 may function as a rest stop for the movement of the receptacle pin 410 as the first cylindrical portion 411 may not travel beyond the junction 423 of the first bore 421 and the second bore 422. In some examples, each of the receptacle pins 410 may be disposed in the openings 413 of the CUH receptacle cover 402 and the through-holes 420 of the CUH receptacle cover 402. One end of the receptacle pins 410 may rest in the openings 413 of the CUH receptacle cover 402 and the other end of the receptacle pins 410 may protrude out of the outer surface 404-1 of the CUH receptacle base 404. In some examples, the first cylindrical portion 411 of the receptacle pins 410 may rest in the openings 413 of the CUH receptacle cover 402. In some examples, the second cylindrical portion 412 may protrude out of the outer surface 404-1 of the CUH receptacle base 404.

Figure 10:
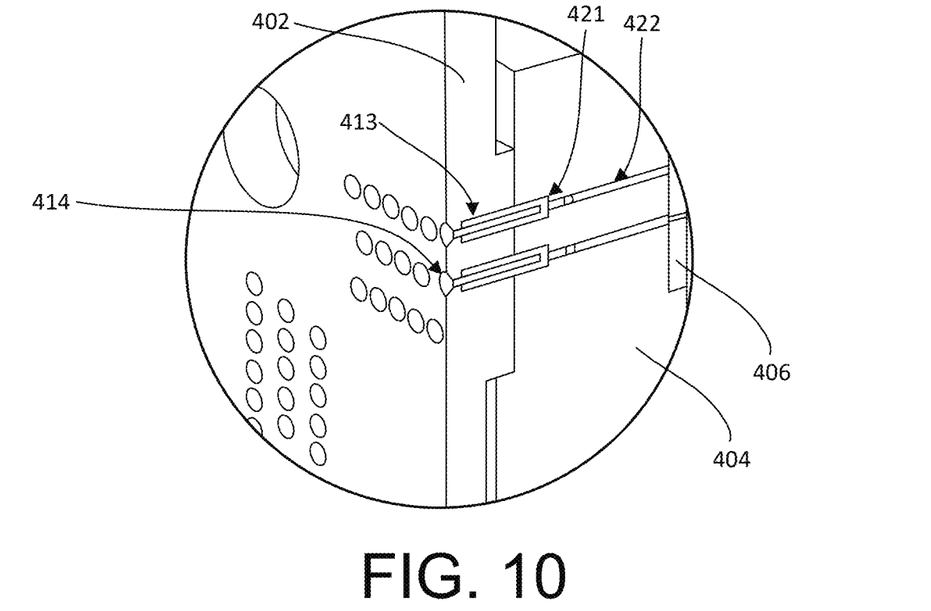
Figure 11:
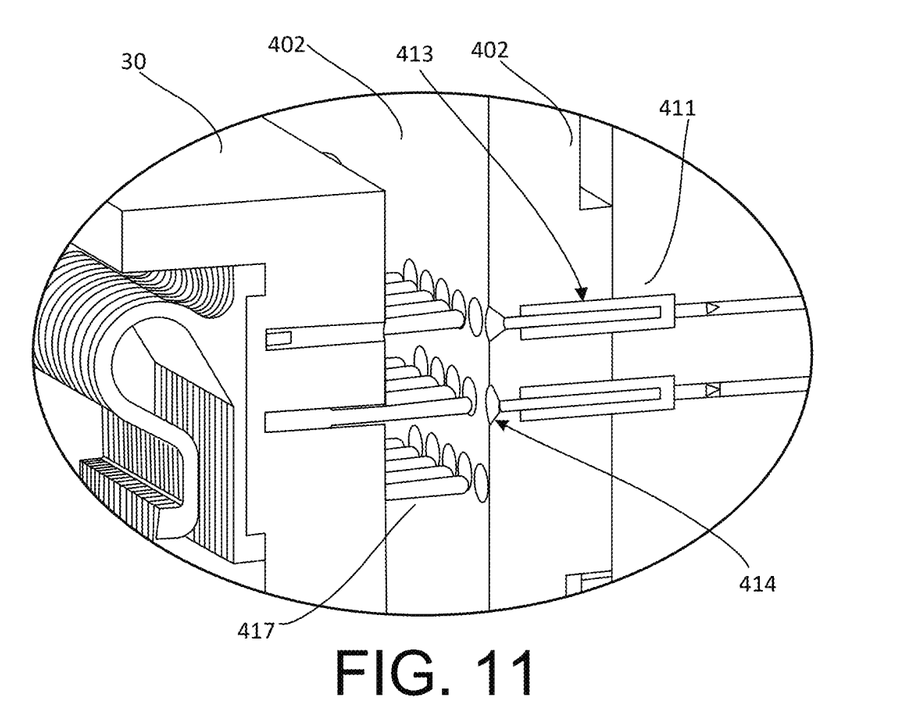

As shown in FIGS. 10-11, openings 413 may be drilled in the CUH receptacle cover 402 to correspond with and match the diameter of the first bore 421 of the precision cut through-holes 420. In some examples, the openings 413 may be precision cut. In some examples, the diameter of the openings 413 may be substantially similar to the diameter of the first bore 421.

One end of the openings 413, distal from the CUH receptacle base 404, may end in a conical flare 414. In some examples, the conical flare 414 may be formed on an outer surface 402-1 of the CUH receptacle cover 402 facing the semiconductor test socket contactor 30. In some examples, the conical flare 414 may provide an interface with other interface pins, such as the interface pins 417 of the semiconductor test socket contactor 30. A conical flare 414 may define an end of the opening at an outer surface 402-1 of the CUH receptacle cover 402.

A diameter of the conical flare 414 at an outer surface of the CUH receptacle cover 402 may be greater than a diameter of the conical flare 414 inside the CUH receptacle cover 402, and the diameter of the conical flare 414 inside the CUH receptacle cover 402 may be lesser than a diameter of the first cylindrical portion 411 of the receptacle pins 410 or a diameter of the openings 413 in the CUH receptacle cover 402. Thus, the combination of the openings 413 and the conical flare 414 may ensure that the receptacle pin 410 does not extend out of the CUH receptacle cover 402.

Figure 12:
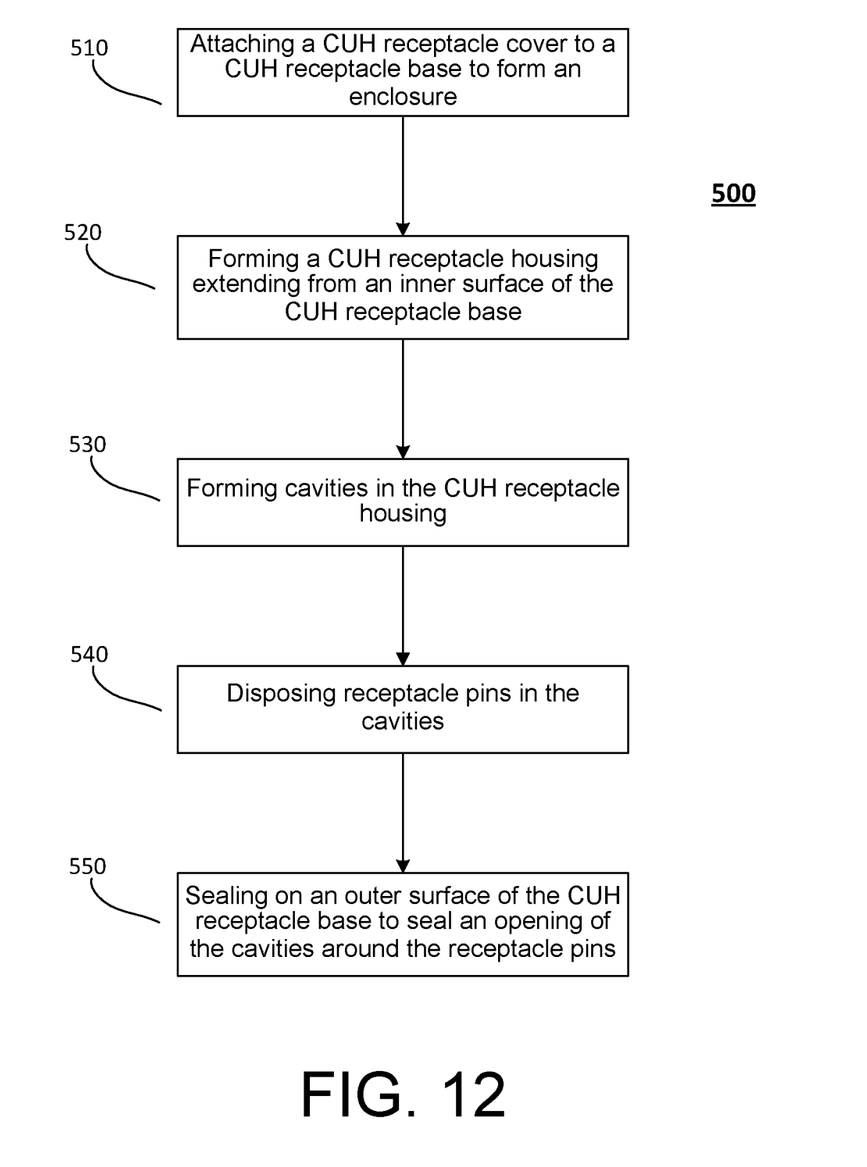
FIG. 12 is a diagram illustrating an example of a method of manufacturing a CUH receptacle assembly.

FIG. 12 is a diagram illustrating an example of a method 500 of manufacturing a CUH receptacle assembly. Although FIG. 12 illustrates an example of operations in sequential order, it will be appreciated that this is merely an example, and that additional or alternative operations may be included. Further, the operations of FIG. 12 and related operations may be executed in a different order than that shown, or in a parallel or overlapping fashion. Descriptions of many of the operations of FIGS. 1-11 are applicable to similar operations of FIG. 12, thus these descriptions of FIGS. 1-11 are incorporated herein by reference. These descriptions may not be repeated for brevity.

In operation 510, a CUH receptacle cover 402 is attached to a CUH receptacle base 404 to form an enclosure. Further details regarding the attaching the CUH receptacle cover 402 to a CUH receptacle base 404 is described above with reference to FIGS. 5-7, and are incorporated herein by reference. In operation 520, a CUH receptacle housing 415 is formed, which extends from an inner surface of the CUH receptacle base 404. In an example, the CUH receptacle housing 415 extends to an inner surface of the receptacle cover 402. Further details regarding the forming of the CUH receptacle housing 415 is described above with reference to FIGS. 5-7, and are incorporated herein by reference.

In operation 530, through-holes 420 are formed in the CUH receptacle housing 415. Further details regarding the forming of the through-holes 420 is described above with reference to FIG. 7, and are incorporated herein by reference. In operation 540, receptacle pins 410 are disposed in the through-holes 420. Further details regarding the disposing of the receptacle pins 410 in the through-holes 420 is described above with reference to FIGS. 6-7, and are incorporated herein by reference. In operation 550, an outer surface of the CUH receptacle base 404 is sealed to seal the opening of the through-holes 420 around the receptacle pins 410. Further details regarding the sealing of the openings of the through-holes 420 is described above with reference to FIGS. 5-7, and are incorporated herein by reference.

In some examples, the method may include forming a first bore 421 of a first diameter distal to the CUH receptacle base and forming a second bore 422 of second diameter proximal to the CUH receptacle base, and the first diameter may be greater than the second diameter. In some examples, the method may include forming of openings 413 in the CUH receptacle cover 402 to correspond with each of the through-holes 420, and a diameter of the openings 413 may be substantially similar to the first diameter. In some examples, the method may include forming a conical flare 414 at an end of each of the openings 413 distal from the CUH receptacle base.

This disclosure, its aspects, and implementations, are not limited to the specific components, assembly procedures or method elements disclosed herein. Many additional components, assembly procedures and/or method elements known in the art consistent with the intended CUH receptacle cover and the CUH receptacle base structures and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such CUH receptacle cover and the CUH receptacle base and related methods, and implementing components and methods, consistent with the intended operation and methods.

It will be understood that, in the foregoing description, when an element is referred to as being on, connected to, electrically connected to, coupled to, or electrically coupled to another element, it may be directly on, connected or coupled to the other element, or one or more intervening elements may be present. When an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A contact unit holder (CUH) receptacle assembly comprising:
   a receptacle cover removably attached to a receptacle base, the receptacle base including a receptacle housing extending from an inner surface of the receptacle base to an inner surface of the receptacle cover;
   a through-hole defined by the receptacle housing, the through-hole extending from an outer surface of the receptacle base to the inner surface of the receptacle cover; and
   a receptacle pin disposed within the through-hole and protruding through a seal at the outer surface of the receptacle base to connect a semiconductor device under test (DUT) and a loadboard, the seal configured to prevent leakage into the through-hole to the loadboard.

2. The CUH receptacle assembly of claim 1, wherein the through-hole comprises a first bore of a first diameter disposed proximal to the receptacle cover and a second bore of second diameter disposed distal to the receptacle cover, and the first diameter being greater than the second diameter.

3. The CUH receptacle assembly of claim 2, further comprising an opening formed in the receptacle cover to correspond with the through-hole, and a diameter of the opening being substantially similar to the first diameter.

4. The CUH receptacle assembly of claim 3, wherein a conical flare defines an end of the opening at an outer surface of the receptacle cover.

5. The CUH receptacle assembly of claim 4, wherein a diameter of the conical flare at the outer surface of the receptacle cover is greater than a diameter of the conical flare inside the receptacle cover, and the diameter of the conical flare inside the receptacle cover is less than the diameter of the opening.

6. The CUH receptacle assembly of claim 2, wherein the receptacle pin comprises a first cylindrical portion and a second cylindrical portion, and a diameter of the first cylindrical portion being greater than a diameter of the second cylindrical portion.

7. The CUH receptacle assembly of claim 6, wherein the first cylindrical portion is configured to be slidable in the first bore and the second cylindrical portion is configured to be slidable in the second bore.

8. The CUH receptacle assembly of claim 1, wherein the seal fills an opening of the through-hole around the receptacle pin.

9. The CUH receptacle assembly of claim 8, further comprising a receptacle base cover removably attached to the receptacle base, the receptacle base cover configured to affix the seal to the outer surface of the receptacle base.

10. The CUH receptacle assembly of claim 1, wherein the receptacle cover is removably attached to the receptacle base using at least one screw passing through a plane of the receptacle cover and a plane of the receptacle base.

11. The CUH receptacle assembly of claim 1, further comprising a recessed channel formed around an outer perimeter of the receptacle housing.

12. The CUH receptacle assembly of claim 1, wherein the through-hole is precision cut.

13. The CUH receptacle assembly of claim 1, wherein the seal comprises a Silicon rubber seal.

14. A method of manufacturing a contact unit holder (CUH) receptacle assembly, the method comprising:
   removably attaching a receptacle cover to a receptacle base;
   forming a receptacle housing extending from an inner surface of the receptacle base to an inner surface of the receptacle cover;
   forming a through-hole in the receptacle housing, the through-hole extending from an outer surface of the receptacle base to the inner surface of the receptacle cover; and
   disposing a receptacle pin within the through-hole, the receptacle pin protruding through a seal at the outer surface of the receptacle base to to connect a semiconductor device under test (DUT) and a loadboard, the seal configured to block air at the semiconductor device DUT from leaking into the through-hole.

15. The method of manufacturing of claim 14, wherein the forming of the through-hole comprises forming a first bore of a first diameter distal to the receptacle cover and forming a second bore of second diameter proximal to the receptacle cover, and the first diameter being greater than the second diameter.

16. The method of manufacturing of claim 15, further comprising forming an orifice in the receptacle cover to correspond with the through-hole, and a diameter of the orifice being substantially similar to the first diameter.

17. The method of manufacturing of claim 16, further comprising forming a conical flare in the orifice at an outer surface of the receptacle cover.

* * * * *